(12) United States Patent
Brunswick

(10) Patent No.: US 9,758,926 B2
(45) Date of Patent: Sep. 12, 2017

(54) METHOD FOR PRODUCING A METALLISED FABRIC, AND RESULTING FABRIC

(71) Applicant: Brunswick & Fils, Paris (FR)

(72) Inventor: Jean-Claude Brunswick, Bordeaux (FR)

(73) Assignee: BRUNSWICK & FILS (FR)

( * ) Notice: Subject to any disclaimer, the term of this patent is extended or adjusted under 35 U.S.C. 154(b) by 0 days.

(21) Appl. No.: 14/824,365

(22) Filed: Aug. 12, 2015

(65) Prior Publication Data

US 2015/0345074 A1    Dec. 3, 2015

Related U.S. Application Data

(63) Continuation of application No. 13/388,105, filed as application No. PCT/IB2010/053587 on Aug. 9, 2010, now abandoned.

(30) Foreign Application Priority Data

Aug. 7, 2009   (FR) ..................................... 09 03899

(51) Int. Cl.
| | | |
|---|---|---|
| *D06M 11/83* | (2006.01) | |
| *C23C 14/20* | (2006.01) | |
| *D06M 10/06* | (2006.01) | |
| *D06M 11/84* | (2006.01) | |
| *D06M 101/32* | (2006.01) | |

(52) U.S. Cl.
CPC ............. *D06M 11/83* (2013.01); *C23C 14/20* (2013.01); *D06M 10/06* (2013.01); *D06M 11/84* (2013.01); *D06M 2101/32* (2013.01); *D06M 2200/25* (2013.01); *Y10T 442/20* (2015.04); *Y10T 442/3398* (2015.04)

(58) Field of Classification Search
CPC ......... D06L 1/14; D06M 10/06; D06M 11/83; D06M 11/84

USPC .......... 427/250, 294, 296, 2.24, 2.31, 389.9
See application file for complete search history.

(56) References Cited

U.S. PATENT DOCUMENTS

| | | | | |
|---|---|---|---|---|
| 2,737,466 | A | * | 3/1956 | Bletzinger .............. B29C 66/71 156/306.6 |
| 2,989,026 | A | * | 6/1961 | Gardner ................ C23C 14/562 118/718 |
| 4,657,807 | A | | 4/1987 | Fuerstman |
| 5,599,585 | A | * | 2/1997 | Cohen ..................... C23C 14/20 427/171 |
| 6,787,488 | B2 | | 9/2004 | Takagi et al. |
| 2008/0057191 | A1 | | 3/2008 | Chang et al. |
| 2009/0008260 | A1 | * | 1/2009 | Chang ................ C23C 18/1651 205/205 |

FOREIGN PATENT DOCUMENTS

| | | |
|---|---|---|
| CN | 1145426 | 3/1997 |
| CN | 1408897 | 4/2003 |
| EP | 2011917 | 1/2009 |
| JP | 62284075 | 12/1987 |

OTHER PUBLICATIONS

Corresponding International Search Report for PCT/IB2010/053587 dated Feb. 25, 2011.
Corresponding Chinese Search Report for 201080035170.3.

* cited by examiner

*Primary Examiner* — Dah-Wei D Yuan
*Assistant Examiner* — Jose Hernandez-Diaz
(74) *Attorney, Agent, or Firm* — The Belles Group, P.C.

(57) ABSTRACT

The invention relates to a method for producing a metallized fabric, including a step of washing a woven substrate, the method including, after the washing step, the following steps: calendering the substrate by applying a compression force to the substrate, and vacuum-metallizing the substrate in a rarefied atmosphere by depositing metal particles so as to form a layer of metal on the substrate.

9 Claims, No Drawings

METHOD FOR PRODUCING A METALLISED FABRIC, AND RESULTING FABRIC

PRIORITY

Priority is claimed as a continuation application to U.S. patent application Ser. No. 13/388,105, filed Mar. 21, 2012, which claims priority as a national stage application, under 35 U.S.C. §371, to PCT/IB2010/053587, filed Aug. 9, 2010, which claims priority to French Application No. 09 03899, filed Aug. 7, 2009. The disclosures of the aforementioned priority applications are incorporated herein by reference in their entirety.

FIELD OF THE INVENTION

The present invention relates to a method for producing a metallized fabric and to any type of fabric which can be obtained by applying such a method.

BACKGROUND OF THE INVENTION

Metallized fabrics have many applications, in particular in the field of protective clothing and infrared reflector devices forming a heat shield.

In a context of energy conservation, infrared reflector devices such as curtains or blinds are highly advantageous insofar as they serve to limit heat losses in winter at the windows of premises, and to protect against heat in summer.

Existing solutions generally comprise the combination of a fabric support and a metal film, obtained by bonding.

The material thus prepared nevertheless has the drawback of being stiff and unpleasant to the touch.

DETAILED DESCRIPTION

The research of the inventor in this field has led him to investigate the advantage of applying the metallization technique, commonly used in the field of packaging, to coat fabrics.

It thus appeared that by treating certain types of fabric, before metallizing them, it was possible to obtain a novel product meeting the requisite specifications, in particular for the abovementioned applications.

It is therefore the object of the invention to provide a method for producing a metallized fabric that has, in particular, a pleasant texture and improved flexibility, while having thermal insulation properties.

It also relates, as novel products, to the fabrics obtained and to their applications.

The method for producing a metallized fabric of the invention is characterized in that it comprises the steps of:
washing a woven substrate in order to remove the size previously applied to the fabric during its manufacture, optionally, dyeing or printing the fabric,
calendering the substrate by applying a compressive force at high temperature,
vacuum metallization of the substrate by deposition of a metal layer in a rarefied atmosphere, the woven substrate comprising yarns having a maximum weight of 70 decitex, both in the warp direction and in the weft or filling direction, with a minimum of 42 filaments per yarn.

In the case of the use of yarns having a weight of 50 decitex, the minimum is 30 filaments per yarn.

The use of fine strands serves to increase the luster of the substrate and thus to increase the luster of the metallized fabric. Preferably, a yarn having a weight of 50 decitex in the warp and filling directions and comprising 36 filaments is used.

The yarns used are flat, neither textured nor twisted.

The tests performed by the inventor have demonstrated that the use of a woven substrate, commonly called a fabric, is essential for achieving the desired flexibility.

Preferably, the woven substrate used, also called fabric, is based on synthetic fibers.

The woven substrate may be based on microfibers, that is to say fibers having more than 100 filaments per decitex, or fine strands, that is to say fibers close to 100 filaments per decitex.

The use of synthetic fibers serves to have a material that can at least partially melt, without burning. The use of microfibers or fine strands serves to preserve the flexibility of the fabric.

The weave of the yarns is dense and very tight. Preferably, the woven substrate comprises at least 42 warp yarns and 40 filling yarns per centimeter. Even more preferably, the woven substrate comprises 44 warp yarns and 41 filling yarns per centimeter.

The fabric washing step is also called desizing. In fact, in the usual fabric manufacturing techniques, a size deposit is applied to the yarns before they are woven. It is advantageous, particularly to preserve the flexibility of the product, to remove this size.

In order to obtain optimal desizing, it is possible to carry out two desizing passes, using caustic soda during one of the two passes.

Calendering is carried out in one or more successive passes on one or on both sides of the substrate, during which a compressive force is applied hot to the fabric.

One pass at 15 m/minute on each side at a temperature of 195° C. and with a force of 80 tonnes serves to obtain the desired effect.

The objective is to remove part of the air present in the fabric. It is found that a vacuum pressure of $2.3 \times 10^{-3}$ (value higher than $2.4 \times 10^{-2}$) is required for carrying out the metallization phase. The construction, that is to say the overall properties of the fabric, and the treatments carried out on the fabric make it possible to remain below this value.

The metallization phase takes place under vacuum at a rate of 420 m/minute, in particular, by metal vapor deposition. The metal deposited may, for example, be aluminum or silver.

It is found that the metallization machines generally used are unsuitable for metallizing large lengths of substrate. The vacuum becomes insufficient and the machine stalls.

It is necessary to use a specific method to remedy this. 200-meter strips of substrate are alternated and placed end to end with 500-meter strips of polyester film to form a continuous strip that is introduced into the metallization machine. This serves to prevent the machine stalling from by loss of vacuum. During the passage of the strips of polyester film, serving as primer, the travel speed is reduced to 180 meters/minute in order to restore the vacuum.

It may be necessary to make one or more preventive interruptions to restore the vacuum, during the passage of the strip, in order to prevent the machine from stalling.

As an alternative, it is possible to use a specific metallization machine, comprising a plurality of vacuum chambers.

EXAMPLE 1

A vacuum deposition test was performed. The fiber to be treated was in the form of a strip that entered the vacuum deposition apparatus. As the strip of fabric passed through the machine, measurements were taken of the pressure in the vacuum chamber. The following results were obtained:

The vacuum present at the start, before the passage of the fabric, had a pressure of $3.2 \times 10^{-4}$ bar.

After the passage of 500 m of a strip of polyester film, a pressure of $4 \times 10^{-4}$ bar was measured.

After the passage of 200 m of fabric after the primer, a pressure of $1 \times 10^{-2}$ bar was measured.

After the passage of a second 500 m strip of polyester film, the vacuum was restored at $5.9 \times 10^{-4}$ bar.

It was also found that the vacuum deposition apparatus malfunctioned when the vacuum became too low. As a consequence, in the case of a fabric based on textured microfiber, the aim is not to exceed a pressure of $4 \times 10^{-2}$ bar. In the case of an untextured fine strand, the aim is not to exceed a pressure of $2.3 \times 10^{-3}$ bar.

EXAMPLE 2

Tests were performed by the inventor, demonstrating the feasible nature of the inventive method. The characteristics of the fabric used are given below:

The warp yarn comprised 100% polyester. It was a flat semi-matte yarn comprising between 44 and 50 filaments per decitex for 43 yarns/cm.

The filling yarn also comprised 100% polyester. It was a flat semi-matte yarn comprising between 44 and 50 filaments per decitex for 43 yarns/cm.

The weave consisted of a taffeta-type toile.

The steps of the method are then carried out as follows:

Desizing takes place by washing at 85° C. in alkaline medium at pH 8/8.5 using surfactants and sequestering agents by a technique known to a person skilled in the art.

Calendering is then carried out at a rate of 15 meters/minute under 80 tonnes at a temperature of 195° C.

Finally, the vacuum metallization takes place at a maximum pressure of $2.3 \times 10^{-3}$ bar.

What is claimed is:

1. A method for producing a metallized fabric, the method comprising:
    washing a woven substrate comprising yarns having a weight of up to 70 decitex in the warp direction and in the filling direction, wherein the washing desizes the woven substrate; then
    calendering the substrate by applying a compressive force to the substrate; and then
    forming the woven substrate and a film into a continuous strip having a plurality of first sections placed in an end to end arrangement with a plurality of second sections, each first section formed from the woven substrate and placed between two of the second sections, and each second section formed of a film;
    depositing, by vacuum metallization within a vacuum chamber, a layer of metal on each first section of the continuous strip by passing the continuous strip through the vacuum chamber,
    wherein each first section of the continuous strip passes through the vacuum chamber at a first travel rate, and each second section of the continuous strip passes through the vacuum chamber at a second travel rate, the second travel speed being less than the first travel rate.

2. The method of claim 1, wherein the woven substrate comprises one of synthetic fibers or microfibers.

3. The method of claim 1, wherein the woven substrate comprises at least 42 warp yarns and 40 filling yarns per centimeter.

4. The method of claim 1, wherein calendering the woven substrate comprises one or more of 1) at least one pass for each side of the woven substrate and 2) application of a compressive force at a temperature of about 195° C.

5. The method of claim 1, wherein depositing the layer of metal on each first section of the continuous strip includes performing metal vapor deposition.

6. The method of claim 1, wherein the formed metal layer is aluminum.

7. The method of claim 1, wherein depositing the layer of metal on each first section of the continuous strip includes maintaining the vacuum chamber at a maximum pressure of $2.3 \times 10^{-3}$ bar.

8. The method of claim 1, wherein the woven substrate comprises a textured microfiber, and depositing the layer of metal on each first section of the continuous strip includes maintaining the vacuum chamber at a maximum pressure of $4 \times 10^{-2}$ bar.

9. The method of claim 1, wherein washing the woven substrate comprises a first washing pass and a second washing pass, at least one of the first washing pass and the second washing pass using caustic soda.

* * * * *